(12) United States Patent
Mori

(10) Patent No.: US 7,118,199 B2
(45) Date of Patent: Oct. 10, 2006

(54) LIQUID JET RECORDING HEAD

(75) Inventor: Toshihiro Mori, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 207 days.

(21) Appl. No.: 10/773,923

(22) Filed: Feb. 5, 2004

(65) Prior Publication Data
US 2004/0155931 A1 Aug. 12, 2004

(30) Foreign Application Priority Data
Feb. 6, 2003 (JP) ............................. 2003-029445

(51) Int. Cl.
*B41J 2/05* (2006.01)
(52) U.S. Cl. ...................................... 347/58
(58) Field of Classification Search ................ 438/21; 257/734; 347/57–59, 63, 65
See application file for complete search history.

(56) References Cited
U.S. PATENT DOCUMENTS
6,084,612 A * 7/2000 Suzuki et al. ................. 347/50
6,659,591 B1 * 12/2003 Sato et al. .................... 347/50
6,680,759 B1 * 1/2004 Ogawa ......................... 349/54
6,766,817 B1  7/2004 da Silva .......................... 137/1

OTHER PUBLICATIONS

Electronic Mail Message from Elson Silva, Ph.D., dated May 3, 2006 with alleged explanation of relevance. [NOTE: Applicants and their counsel did not prepare, modify or otherwise alter this explanation, which was apparently prepared by Dr. Silva, and therefore expressly disclaim any representation(s) regarding the accuracy of that explanation].

* cited by examiner

*Primary Examiner*—Lamson Nguyen
*Assistant Examiner*—Lisa M. Solomon
(74) *Attorney, Agent, or Firm*—Morgan & Finnegan, L.L.P.

(57) ABSTRACT

This invention is intended to connect a dummy lead while preventing depression of a resin that seals electric connection sections, without bringing the dummy lead into contact with a recording element substrate or without taking the dummy lead for a lead electrode. The dummy lead which is provided inward of an opening of a flexible film wiring substrate to be shorter than the lead electrode, and which is not electrically connected to an electrode pad is provided to be adjacent to the lead electrode.

17 Claims, 6 Drawing Sheets

LIQUID JET RECORDING HEAD

BACKGROUND OF THE INVENTION

1. Field of the Invention

The present invention relates to a liquid jet recording head that discharges a recording liquid as a droplet and that records information on a recording target medium.

2. Related Background Art

Electric connection sections of a flexible film wiring substrate (wiring film) of a liquid jet recording head, such as an inkjet recording head, are covered with a sealing liquid. FIG. 6 is a typical view of the electric connection sections of the flexible film wiring substrate of a conventional inkjet recording head.

In FIG. 6, reference numeral 1 denotes a plurality of recording element substrates that includes a plurality of discharge energy generation elements (not shown) which apply a discharge energy to the recording liquid and a plurality of discharge ports 6 that discharge the recording liquid, and that discharges the recording liquid by a pressure generated by the discharge energy. Reference numeral 8 denotes a supporting member onto which each of a plurality of recording element substrates 1 are fixedly attached in parallel. Reference numeral 11 denotes a flexible film wiring substrate (wiring film) that includes a plurality of wirings (not shown) electrically mounted on the plural recording element substrates 1 and transmitting an electrical signal from a recording apparatus main body (not shown) to each of a plurality of recording element substrates 1, and a wiring protection layer (resist) for protecting the wirings. Reference numeral 9 denotes a supporting plate that is fixedly attached to the supporting member 8 and that holds and fixes the flexible film wiring substrate 11. Reference numeral 18 denotes a first sealing resin coated to protect part of electric connection sections among peripheries of the plural recording element substrates 1, the plural recording element substrates 1, and the flexible film wiring substrate 11 from corrosion by the recording liquid and from a short-circuit through the recording liquid. Reference numeral 19 denotes a second sealing resin (indicated by a broken line) that covers electric connection sections between a plurality of electrode pads 7 and a plurality of lead electrodes 13 provided on the flexible film wiring substrate 11 to protect the electric connection sections from an external force generated by, for example, wiping.

Further, Japanese Patent Application Laid-Open No. H10-44441 discloses an inkjet head having dummy leads equal in shape to lead electrodes or resin reception sections equal in material to the lead electrodes arranged in four corners of an opening portion of the flexible film wiring substrate (wiring film) 11. By narrowing a gap between an inner peripheral portion of the opening portion of the flexible film wiring substrate (wiring film) 11 and each recording element substrate 1 using such dummy leads or resin reception sections, the second sealing rein is prevented from falling into this gap, and the second sealing resin can sufficiently seals the electric connection sections between the electrode pads provided on the recording element substrates 1 and the lead electrodes provided on the flexible film wiring substrate 11.

However, even with the configuration as described in Japanese Patent Application Laid-Open No. H10-44441, if a plurality of recording element substrates 1 are provided in, for example, one opening portion (device hole) of the flexible film wiring substrate 11, a gap larger than an arrangement pitch of the lead electrodes is formed between the lead electrodes connected to the electrode pads located on the outermost positions of the adjacent recording element substrates 1, respectively. In that case, the second sealing resin, which has covered the lead electrodes, may possibly be depressed to a position below the lead electrodes. If so, the electric connection sections between the electrode pads provided on the recording element substrates and the lead electrodes provided on the flexible film wiring substrate cannot be sufficiently sealed with the resin, with the result that the lead electrodes are exposed to thereby often, disadvantageously cause an electric short-circuit through the recording liquid.

Furthermore, if the dummy leads equal in shape to the lead electrodes are provided in the gaps between the flexible film wiring substrate and the recording element substrates, between the lead electrodes respectively connected to the electrode pads located at the outermost positions of the adjacent recording element substrates 1 as described in Japanese Patent Application Laid-Open No. H10-44441, then the dummy leads disadvantageously, often contact with the recording element substrates to cause a short-circuit or the dummy leads are disadvantageously, often taken for the lead wirings and connected to the respective electrode pads.

SUMMARY OF THE INVENTION

It is an object of the present invention to provide a liquid jet recording head which enables an operator to provide dummy leads without contacting the dummy leads with recording element substrates or without taking the dummy leads for lead electrodes.

It is another object of the present invention to provide a highly reliable liquid jet recording head which can ensure electrical connection between electrode pads provided on a recording element substrate and lead electrodes provided on a flexible film wiring substrate, thereby preventing depression of a sealing resin occurring when the sealing resin is coated to protect electric connection sections from an external force caused by wiping or the like, and ensuring coating the electric connection sections in a stable shape from one end to the other end of a desired coating target region when the sealing resin is cured.

Further, it is another object of the present invention to provide a liquid jet recording head comprising a recording element substrate which includes a recoding liquid discharge port, and includes a discharge energy generation element that generates a discharge energy, a flexible film wiring substrate which includes an opening for exposing the recording element substrate to an outside, and includes a plurality of lead electrodes projecting inward of the opening, the flexible film wiring substrate connected to the recording element substrate so as to apply an electrical signal to the discharge energy generation element, a plurality of electrode pads provided on the recording element substrate, the electrode pads electrically connected to the lead electrodes, respectively so as to electrically connect the recording element substrate to the flexible film wiring substrate, and a dummy lead which is provided inward of the opening to protrude to be shorter than each of the lead electrodes, and which is not electrically connected to each of the electrode pad, the dummy lead provided to be adjacent to at least one lead electrode group comprising of a plurality of lead electrode pads among the plurality of lead electrodes.

DETAILED DESCRIPTION OF THE PREFERRED EMBODIMENTS

The embodiments of the present invention will be described hereinafter with reference to the drawings.

Figure 1:
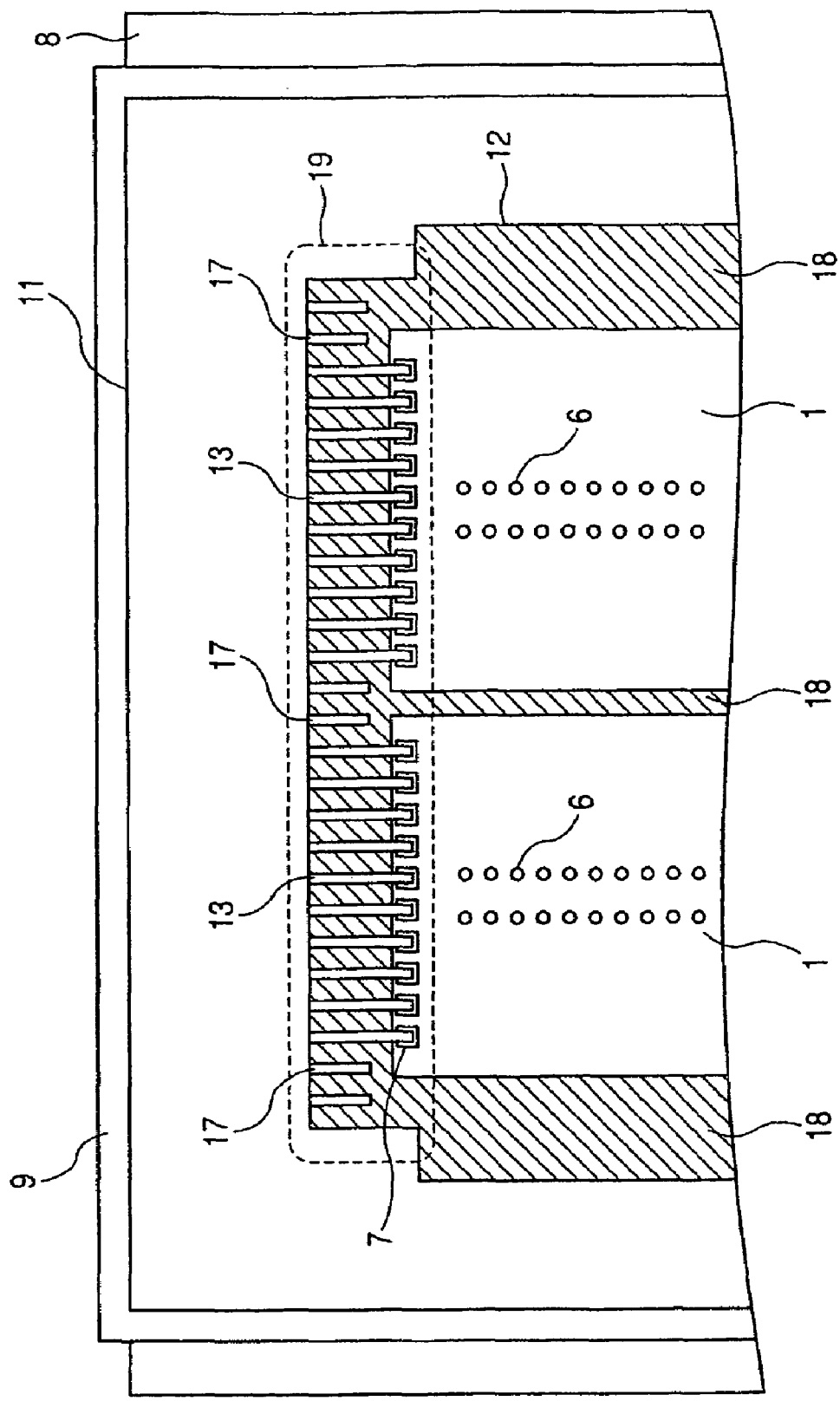
FIG. 1 is a typical view which illustrates a liquid jet recording head in the first embodiment according to the present invention.

FIG. 1 is a typical top view which illustrates a liquid jet recording head in the first embodiment according to the present invention.

In the first embodiment, a plurality of recording element substrates are arranged on the supporting member 8. Although two recording element substrates are employed herein for the convenience of description, the present invention can be suitably applied to instances in which two or more recording element substrates are employed.

In FIG. 1, reference numeral 6 denotes each of a plurality of discharge ports for discharging a plurality of discharge energy generation elements (not shown) that apply discharge energy to a recording liquid and the recording liquid. Reference numeral 1 denotes a plurality of recording element substrates that discharges the recording liquid by a pressure generated by the discharge energy. Reference numeral 8 denotes a supporting member to which each of a plurality of recording element substrates 1 are fixedly attached. Reference numeral 11 denotes a flexible film wiring substrate that includes a plurality of wirings electrically mounted on the plural recording element substrates 1 and transmitting an electrical signal from a recording apparatus main body (not shown) to each of a plurality of recording element substrates 1. Reference numeral 9 denotes a supporting plate fixedly attached to the supporting member 8 and fixing and holding the flexible film wiring substrate 11. Reference numeral 18 denotes a first sealing resin coated on outer peripheries of the recording element substrates 1 to protect part of electric connection sections among the peripheries of the plural recording element substrates 1, the plural recording element substrates 1, and the flexible film wiring substrate 11 from corrosion and short-circuit by the recording liquid. The first sealing resin 18 is also coated on an outer periphery of the flexible film wiring substrate 11 so as to protect the wirings and the like on the flexible film wiring substrate 11 from corrosion by the recording liquid. Reference numeral 19 denotes the second sealing resin that are covered on electric connection sections between a plurality of electrode pads (not shown) provided on the plural recording element substrates 1 and a plurality of lead electrodes 13 provided on the flexible film wiring substrate 11 so as to protect the electric connection sections from an external force generated by, for example, wiping.

The first embodiment is characterized as follows. The lead electrodes 13 are provided at a desired wiring pitch in an opening portion (device hole) 12 provided to expose the plural recording element substrates 1 to the flexible film wiring substrate 11. In addition, if a plurality of recording element substrates 1 are arranged on the supporting member 8, dummy leads 17 are arranged substantially at the same arrangement pitch as that of the lead electrodes 13 in regions in which, for example, two recording element substrates 1 are adjacent to each other and regions in which the lead electrodes 13 protruding from the flexible film wiring substrate 11 into the device hole 12 and arranged at the predetermined arrangement pitch are not provided at all (i.e., the regions in which the lead electrodes 13 at a wider pitch than the predetermined arrangement pitch of the lead electrodes 13 are not present at all). As a result, the leads 13 and 17 are all arranged at the desired arrangement pitch in a space from one end portion of one side of the device hole 12 to the other end portion thereof.

Each dummy lead 17 is provided to be adjacent to at least one lead electrode group consisting of a plurality of lead electrodes 13.

In FIG. 1, the second sealing resin 19 is coated so as to entirely cover the region that includes the electric connection sections between the electrode pads of the recording element substrates 1 and the lead electrodes 13 of the flexible film wiring substrate 11, and that includes the dummy leads 17. By so constituting, the first sealing resin 18 coated on the outer peripheries of the recording element substrates 1 is raised up to heights of the lead electrodes 13 and the dummy leads 17. Further, since the lead electrodes 13 and the dummy leads 17 are arranged substantially at the uniform arrangement pitch, the second sealing resin 19 turns into a state in which the second resin 19 is held by the lead electrodes 13 and the dummy leads 17. Therefore, the second sealing resin 19 can be coated onto a desired sealing target region in a uniform shape without generating a phenomenon that the second sealing resin 19 is depressed deeply.

The leads 13 and 17 are arranged substantially at the uniform arrangement pitch, i.e., equidistantly. However, even if the arrangement pitches of the leads 13 and 17 are set in nonuniform within a range in which the depression of the second sealing resin 19 stated above does not occur, this does not depart from the spirit of the present invention. It is, however, preferable that a gap between the lead electrode 13 and the dummy lead 17 is set to satisfy a relationship of $0.75P \leq P \leq 1.25P$, where P is the arrangement pitch of the lead electrodes 13. The knowledge on the gap between the leads also applies to the second and third embodiments to be described later.

Furthermore, in the first embodiment, the dummy lead 17 is shorter than the lead electrode 13. Therefore, it is possible to prevent the dummy leads 17 from contacting with any of the recording element substrates 1 to cause a short-circuit and to prevent the dummy leads 17 from being taken for the lead electrodes 13 and connected to the respective electrode pads 7.

Thus, it is important that each dummy lead 17 is long enough to ensure discriminating the dummy lead 17 from the ordinary lead electrode 13 and to prevent the second sealing resin 19 from being depressed as stated above. Namely, it is preferable that the length of each dummy lead 17 is set so that a tip end of the dummy lead 17 does not contact with an end face of any of the recording element substrates 1, in accordance with bonding accuracy for bonding the flexible film wiring substrate 11. The present inventor discovered, after repeated considerations, that it is optimum to set the length of the dummy lead 17 at about 40 to 60% of the length of the lead electrode 13 so as to be able to maintain a bonding performance of each lead electrode 13 and maintain a coating performance of the second sealing resin 19. Nevertheless, even if the length of the dummy lead 17 is out of the above-stated range, this does not depart from the spirit of the present invention as long as the objects of the present invention, that is, to ensure distinguishing the dummy leads 17 from the ordinary lead electrodes 13 and to prevent the second sealing resin 19 from being depressed can be realized. In the first embodiment, the length of each lead electrode 13 is set at 560 micrometers and that of each dummy lead 17 is set at 250 micrometers.

Each dummy lead 17 is provided to be adjacent to at least one lead electrode group consisting of a plurality of lead electrodes 13.

Further, in a manufacturing process for the flexible film wiring substrate 11, if the lead electrodes 13 and the dummy leads 17 are manufactured in the same manufacturing steps, it is possible to reduce a manufacturing cost.

Figure 2:
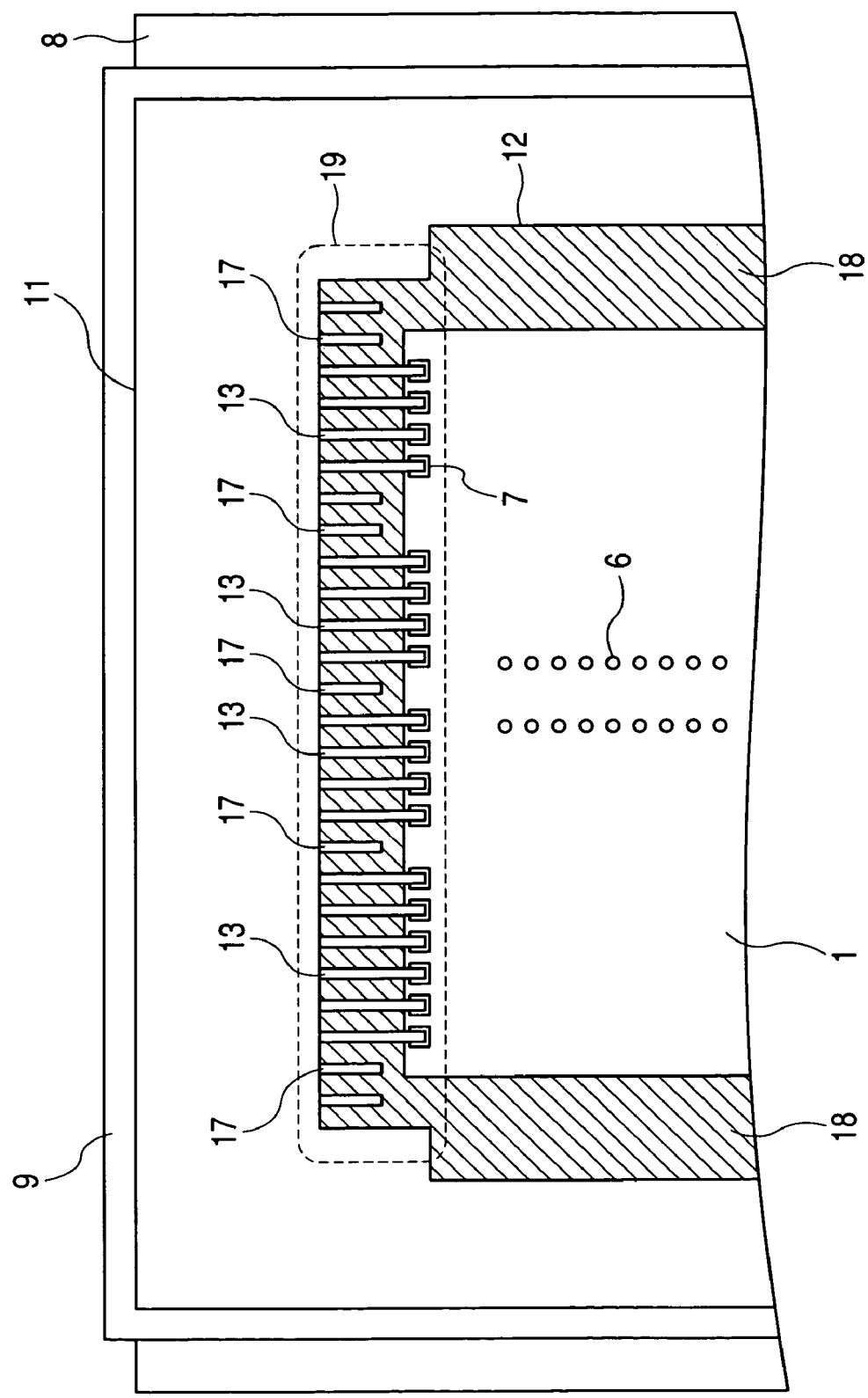
FIG. 2 is a typical view which illustrates a liquid jet recording head in the second embodiment according to the present invention.

FIG. 2 is a typical top view of the liquid jet recording head in the second embodiment according to the present invention.

The second embodiment is equal to the first embodiment except that the electrode pads 7 are not arranged uniformly on one recording element substrate 1.

As shown in FIG. 2, on the flexible film wiring substrate 11 used for the liquid jet recording head in the second embodiment, a plurality of lead electrodes 13 are divided to a plurality of lead electrode groups on one recording element substrate 1. In each region in which the gap between the adjacent lead electrode groups is larger than the arrangement pitch at which the lead electrodes 13 are arranged, each dummy lead 17 is arranged so that gaps between the leads including the lead electrodes 13 are substantially equal. It is, however, preferable that the distance between the lead electrode 13 and the dummy lead 17 is set to satisfy the relationship of $0.75P \leq P \leq 1.25P$, where P is the arrangement pitch of the lead electrodes 13.

Each dummy lead 17 is provided to be adjacent to at least one lead electrode group consisting of a plurality of lead electrodes 13. By so constituting, the second embodiment can exhibit the same advantages as those of the first embodiment.

Since the basic configuration of the liquid jet recording head is already described with reference to FIG. 1, it will not be described herein.

Figure 3:
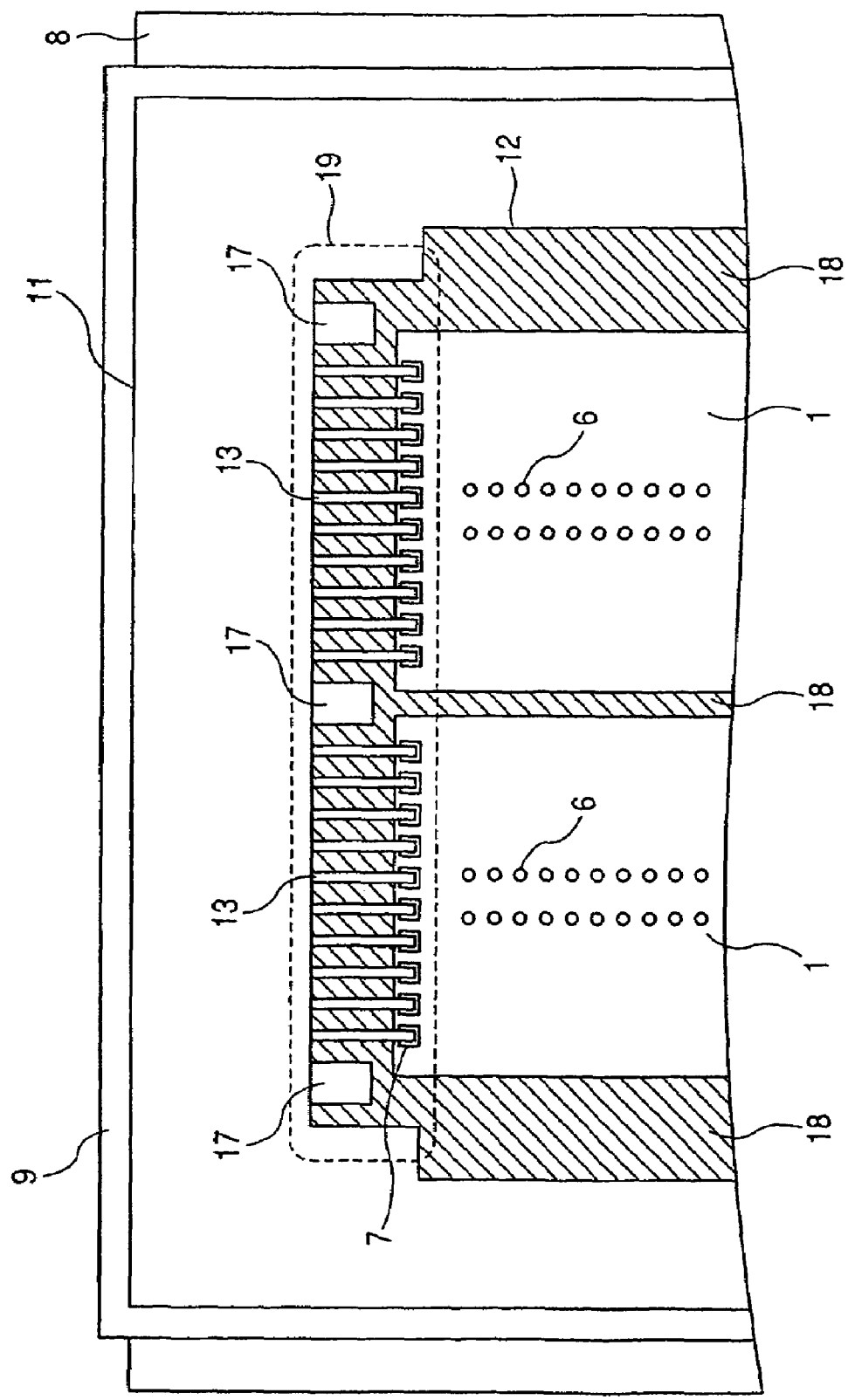
FIG. 3 is a typical view which illustrates a liquid jet recording head in the third embodiment according to the present invention.

FIG. 3 is a typical top view of the liquid jet recording head in the third embodiment according to the present invention.

The third embodiment is equal to the preceding first and second embodiments except that the generation of a gap larger than the desired arrangement pitch is prevented by adjusting not the number of the dummy leads 17 but a width of the dummy lead 17.

As shown in FIG. 3, on the flexible film wiring substrate 11 used for the liquid jet recording head in the third embodiment, each wide dummy leads 17 adjusted so that the distances between the leads including the lead electrodes 13 are substantially equal is arranged in a gap larger than the arrangement pitch of the lead electrodes 13. By so arranging, the third embodiment can exhibit the same advantages as those of the first and second embodiments.

The gap formed by the arrangement pitch between the adjacent lead electrodes 13 or between the lead electrode 13 and the dummy lead 17 may be set so as not to cause a short-circuit between the adjacent leads and so as not to depress the second sealing resin 19. Actually, depending on a bonding method to be adopted, by setting the gap at a minimum in a range in which the short circuit between the adjacent leads does not occur, the depression of the second sealing resin 19 may be prevented. Alternatively, if the gap between the leads that may possibly cause the depression of the second sealing resin 19 has to be unavoidably adopted because of the configuration of the liquid jet recording head, the widths of the dummy leads 17 may be appropriately increased. The present inventor discovered, after repeated considerations, that it is optimum to set the gap at about 40 to 100 micrometers so as to be able to prevent the short-circuit between the adjacent leads and to prevent the depression of the second sealing resin 19. Nevertheless, even if the gap is out of the above-stated range, this does not depart from the spirit of the present invention as long as the objects of the present invention, that is, to prevent the short-circuit between the adjacent leads and to prevent the depression of the second sealing resin 19 can be realized. It is, however, preferable that the distance between the lead electrode 13 and the dummy lead 17 is set to satisfy the relationship of $0.75P \leq P \leq 1.25P$, where P is the arrangement pitch of the lead electrodes 13.

Each dummy lead 17 is provided to be adjacent to at least one lead electrode group consisting of a plurality of lead electrodes 13.

The advantage of the third embodiment over the first and second embodiments is in that a holding ability of the sealing resin for preventing the depression of the second sealing resin 19 is excellent. Since the basic configuration of the liquid jet recording head is already described with reference to FIG. 1, it will not be described herein.

Figure 4A:
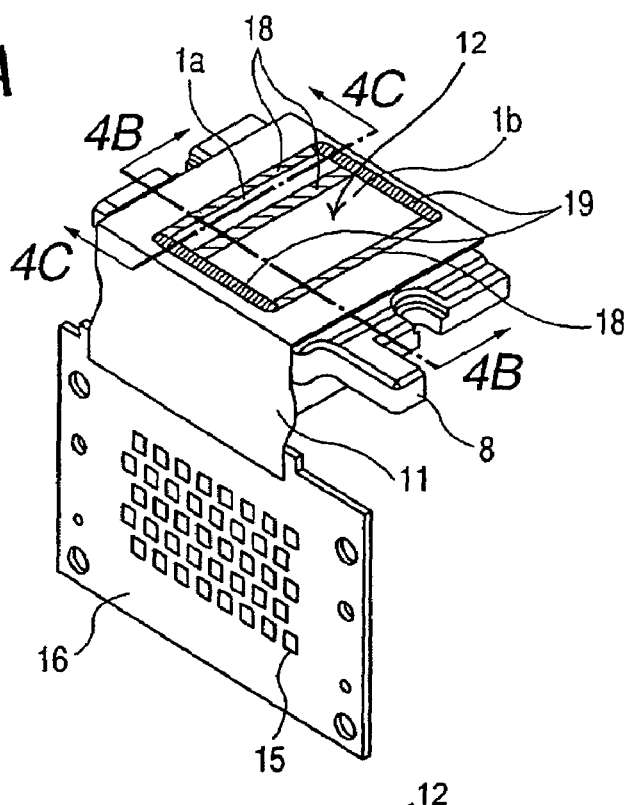
FIG. 4A is a perspective view which illustrates a recording element unit into which a flexible film wiring substrate is incorporated according to the present invention.
Figure 4B:
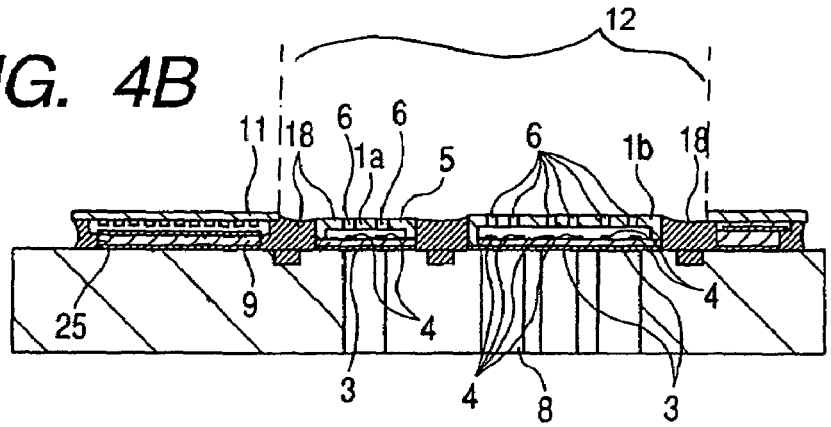
FIG. 4B is a cross-sectional view taken along a line 4B—4B of FIG. 4A.
Figure 4C:
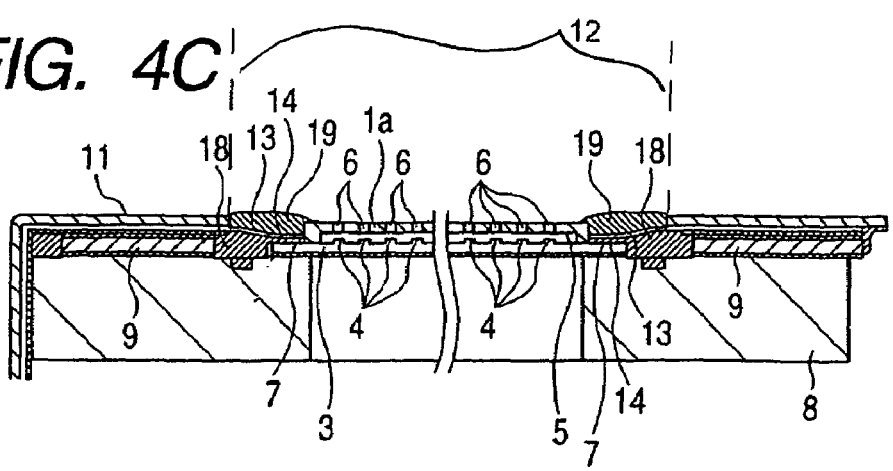
FIG. 4C is a cross-sectional view taken along a line 4C—4C of FIG. 4A.

The liquid jet recording head having the above-stated constituent elements mounted thereon according to the present invention will next be described with reference to FIGS. 4A to 4C. FIG. 4A is a perspective view of the outline of the liquid jet recording head according to the present invention. FIG. 4B is a cross-sectional view taken along a line 4B—4B of FIG. 4A. FIG. 4C is a cross-sectional view taken along a line 4C—4C of FIG. 4A.

As shown in FIGS. 4A to 4C, the liquid jet recording head according to the present invention is constructed by a member that includes a plurality of recording element substrates (two recording element substrates for convenience of description herein) 1a and 1b different in shape and size, the supporting member 8 and the flexible film wiring substrate 11. In a discharge port plate 5 on a front surface of each of the recording element substrates 1a and 1b, a plurality of discharge ports 6 for discharging the recording liquid are formed in two columns to correspond to discharge energy generation elements (e.g., electro-thermal conversion elements). At a center of a rear surface thereof, recording liquid supply ports 3 penetrated to supply the recording liquid are formed at a length substantially equally to a length of the discharge ports 6 in an arrangement direction. Further, a plurality of electrode pads 7 electrically connected to the discharge energy generation elements 4, respectively, are provided on each end portion of each of the recording element substrates 1 (1a or 1b). On these electrode pads 7, stud bumps 14 using ordinary wirings are provided, respectively. Alternatively, solder bumps or plated bumps other than the stud bumps may be provided thereon, respectively. The rear surface of each of the recording element substrates 1a and 1b is arranged above the supporting member 8 to be proximate thereto and fixedly bonded to a predetermined position at accuracy as high as several micrometers to several tens of micrometers. Although only a few discharge ports 6 and a few electrodes 7 are shown, several tens to several hundreds of discharge ports 6 and electrodes 7 are actually provided on each recording head.

An opening portion 12 is provided in the flexible film wiring substrate 11 to expose each of the plurality of recording element substrates 1 (1*a* and 1*b*). The electrode leads 13 electrically connected to the electrode pads 7 on the respective recording element substrates 1 (1*a* and 1*b*) as many as the electrode pads 7 are provided around the opening portion 12. The electrode leads 13 are electrically connected to the electrode pads 7 on the respective recording element substrates (1*a* and 1*b*) through the stud bumps 14. The connection between the electrode leads 13 and the electrode pads 7 is established by applying an arbitrary load and an arbitrary ultrasonic vibration to the electrode leads 13 and the electrode pads 7 while heating the electrode connection sections at 150 to 200° C., thereby causing metal coupling to connection surfaces between the gold bumps 14 on the electrode pads 7 and the electrode leads 13 which are provided on the flexible film wiring substrate 11 and which are plated with gold. In the embodiments, single-point bonding is employed. Alternatively, any other connection method such as a gang bonding method for collectively connecting all the connection sections using thermo-compression unit, a reflow method for melting the solder bumps, a wire bonding method for connecting the corresponding electrodes by wires, or an ACF connection method may be used.

In the liquid jet recording head according to the present invention, the flexible film wiring substrate 11 is formed to completely cover the supporting plate 9 and to project in the form of a pent roof by a predetermined amount, and is fixedly bonded onto the supporting plate 9. Therefore, there is no need to coat the first sealing resin 18 while the outer periphery of the flexible film wiring substrate 11 protrudes toward the discharge portion surface so as to protect the flexible film wiring substrate 11 from corrosion caused by the recording liquid. Therefore, it suffices to coat the first sealing resin 18 onto the rear surface of a part of the flexible film wiring substrate 11 protruding from the supporting plate 9 along the outer peripheral side surface of the supporting plate 9. According to the present invention, if such a material that if the first sealing resin 18 is coated on the predetermined position by a predetermined amount at a low viscosity, the first sealing resin 18 spontaneously spreads along the outer periphery of the flexible film arrangement substrate 11 by a capillary force is used, a good coating stated can be attained. As the first sealing resin 18, NR200C which is a thermosetting silicon-denatured epoxy resin and is manufactured by Japan Rec Co., Ltd., for example, is optimum.

The first thermosetting sealing resin 18 is coated to protect part of the electric connection sections (around the stud bumps and the electrode leads 13) among concave portions formed by the opening portion 12 of the flexible film wiring substrate 11, the opening portion 10 of the supporting plate 9, and the surrounding of the recording element substrates 1, the plurality of recording element substrates 1, and the flexible film wiring substrate 11. As this first thermosetting sealing resin 18, a thermosetting sealing agent, such as NR200C which is a thermosetting silicon denatured epoxy resin and which is manufactured by Japan Rec Co., Ltd., which has an elastic force after being cured is used to seal the electric connection sections. Further, the second thermosetting sealing resin 19 is used to coat and thereby protect upper portions of the electric connection sections between the plurality of recording element substrates 1 and the flexible film wiring substrate 11 (the regions between which the electrode leads are put and which include the flexible film wiring substrate to the discharge port plate). As this second thermosetting sealing resin 19, a thermosetting sealing agent, such as CV5420D which is a thermosetting epoxy resin and which manufactured by Matsushita Electric Works, Ltd., which exhibits a quite high hardness and has a mechanical strength after being cured, is used. These thermosetting sealing resins 18 and 19 are coated and simultaneously cured, thereby simultaneously curing a plurality of different thermosetting sealing resins. In each of the first to third embodiments stated above, the sealing resins 18 and 19 are cured at 100° C. for one hour, cured at 150° C. for three hours, whereby the sealing resins 18 and 19 are thermally cured. Curing conditions may be determined in various manners based on damages that may be caused by heats emitted from the respective devices to be used.

Thereafter, a second wiring substrate 16 on which external input pads 15 for applying the electrical signal indicating recording information or the like to the liquid jet recording head from the recording apparatus main body side is electrically connected to the flexible film wiring substrate 11. Needless to say, the flexible film wiring substrate 11 and the second wiring substrate 16 may be formed out of the same substrate integrally with each other. The flexible film wiring substrate 11 is bent along an outline of a member that stores an ink and bonded onto the supporting plate 9, whereby the liquid jet recording head shown in FIG. 1 can be manufactured.

Figure 5:
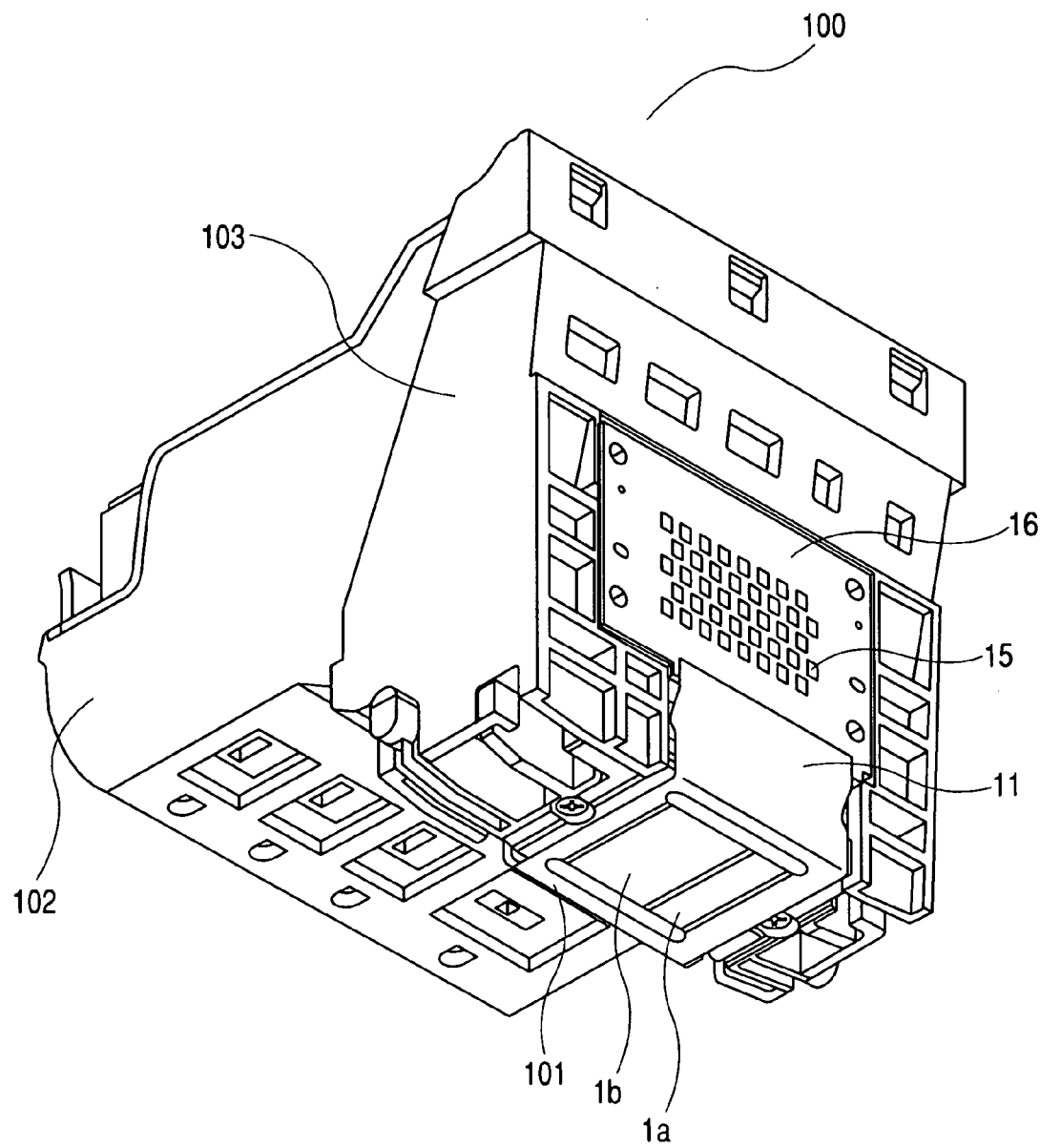
FIG. 5 is a perspective view which illustrates a recording head according to the present invention.
Figure 6:
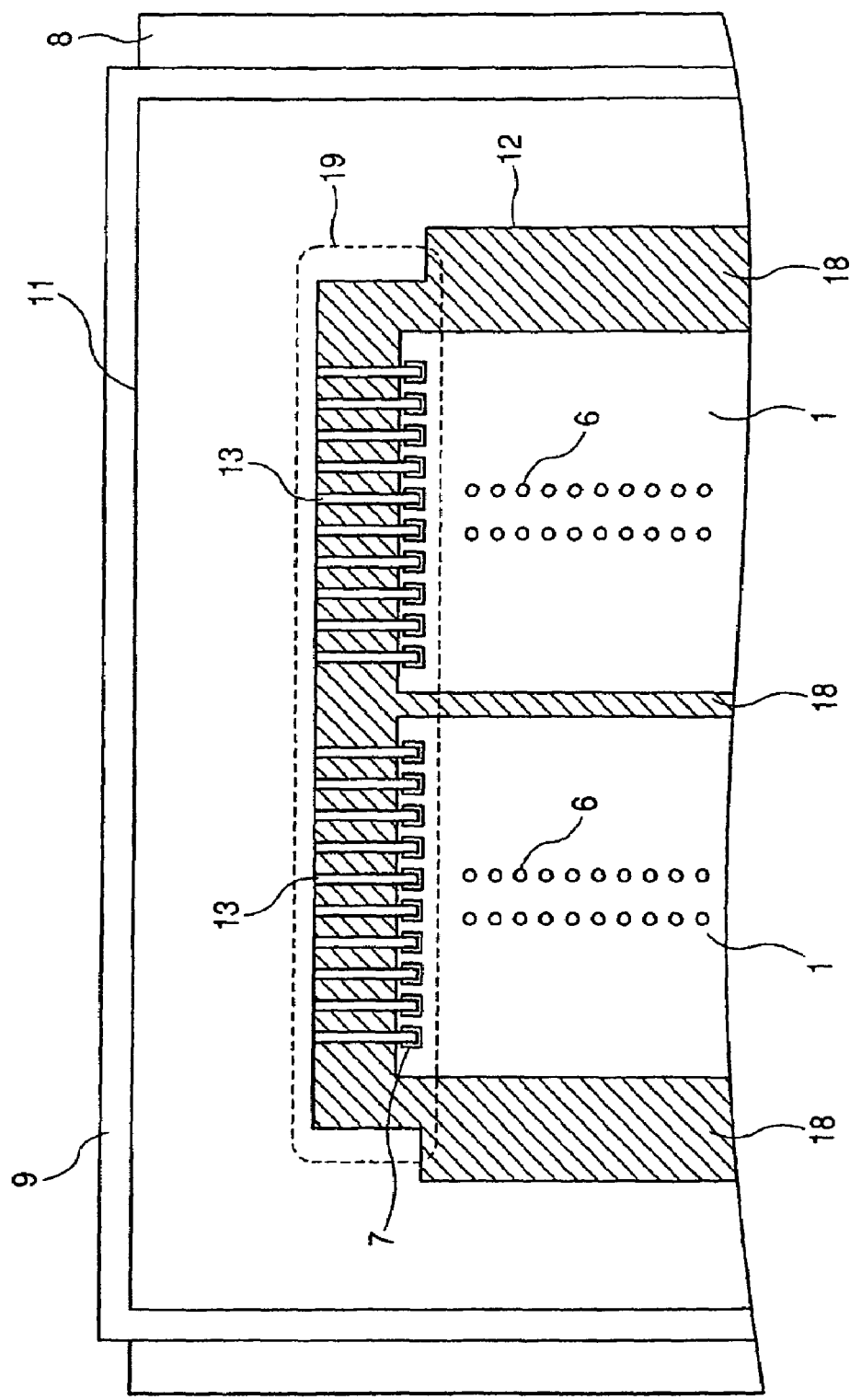
FIG. 6 is a typical view which illustrates part of a conventional liquid jet recording head related to the present invention.

FIGS. 4A, 4B, 4C and FIG. 5 are explanatory views for describing a preferred head cartridge and a preferred recording head for which the above-stated embodiments are carried out or to which the embodiments are applied. With reference to FIGS. 4A to 5, the respective constituent elements of the head cartridge and the recording head will be described.

As can be seen from the perspective view of FIG. 5, the recording head according to each of the embodiments is one constituent element of a recording head cartridge 100. The recording head cartridge 100 includes a recording element unit 101 that includes the recording head, a tank holder 102 that detachably holds ink tanks storing inks of various colors such as a black ink, a cyan ink, a magenta ink, and a yellow ink, respectively, and an ink supply unit 103 that supplies the inks stored in the respective ink tanks to the recording head. This recording head cartridge 100 is detachably attached to a carriage or the like while being electrically connected to the inkjet recording apparatus main body, and used for inkjet-printing for printing recording information on the recording medium or the like.

As described so far, according to the respective embodiments, each dummy lead shorter than each lead electrode is provided between a plurality of lead electrode groups each constructed by a plurality of lead electrodes so as not to generate the gap larger than the desired arrangement pitch of the lead electrodes provided in the device hole of the flexible film wiring substrate. It is thereby possible to prevent the dummy leads from contacting with the recording element substrates to cause the short-circuit, and from being taken for the lead electrodes and being connected to the respective electrode pads provided on the recording element substrates. Furthermore, it is possible to prevent the depression of the second sealing resin that may occur when the second sealing resin is coated to protect the electric connection sections between the electrode pads and the lead electrodes from the external force generated by wiping or the like. This can ensure that the second sealing resin can have a stable resin shape from one end to the other end of a desired coated region, and cover the electric connection sections when the second sealing resin is cured. Thus, the highly reliable liquid jet recording head can be provided.

Furthermore, since the plurality of lead electrodes and the plurality of dummy leads on the flexible film wiring substrate can be formed in the same manufacturing step, the liquid jet recording head can be efficiently manufactured without increasing manufacturing cost.

What is claimed is:

1. A liquid jet recording head comprising:
   a recording element substrate which includes a recoding liquid discharge port, and includes a discharge energy generation element that generates a discharge energy;
   a flexible film wiring substrate which includes an opening for exposing the recording element substrate to an outside, and includes a plurality of lead electrodes projecting inward of the opening, the flexible film wiring substrate connected to the recording element substrate so as to apply an electrical signal to the discharge energy generation element;
   a plurality of electrode pads provided on the recording element substrate, the electrode pads electrically connected to the lead electrodes, respectively so as to electrically connect the recording element substrate to the flexible film wiring substrate;
   a dummy lead which is provided inward of the opening to protrude to be shorter than each of the lead electrodes, and which is not electrically connected to each of the electrode pad, the dummy lead provided to be adjacent to at least one lead electrode group comprising of a plurality of lead electrodes among the plurality of lead electrodes; and
   wherein a plurality of the recording element substrates are provided in the opening, and the dummy lead is provided correspondingly between end portions of the plurality of recording element substrates adjacent to each other.

2. The liquid jet recording head according to claim 1, wherein the dummy lead is provided on the flexible film wiring substrate.

3. The liquid jet recording head according to claim 1, wherein electric connection sections between the lead electrodes and the electrode pads, and the dummy lead are sealed by a sealing resin so as to cover the electric connection sections and the dummy leads.

4. The liquid jet recording head according to claim 1, wherein the dummy lead is provided near each of both end portions of the lead electrode group in an arrangement direction.

5. The liquid jet recording head according to claim 1, wherein the dummy lead is arranged at a pitch equal to a pitch at which the lead electrodes are arranged.

6. The liquid jet recording head according to claim 1, wherein a plurality of the dummy leads are arranged between the adjacent lead electrode groups, thereby preventing a gap larger than a desired gap from being formed between the plurality of lead electrodes.

7. The liquid jet recording head according to claim 1, wherein a gap between each of the lead electrodes and the dummy lead is set to fall within a range of $0.75P \leq P \leq 1.25P$, where P is an arrangement pitch of the plurality of lead electrodes.

8. The liquid jet recording head according to claim 1, wherein the dummy lead has a larger width than a width of each of the lead electrodes, thereby preventing a gap larger than a predetermined gap from being formed between the plurality of lead electrodes.

9. The liquid jet recording head according to claim 1, wherein the lead electrodes and the dummy lead are manufactured in a same manufacturing step.

10. A liquid jet recording head comprising:
    a recording element substrate which includes a recoding liquid discharge port, and includes a discharge energy generation element that generates a discharge energy;
    a flexible film wiring substrate which includes an opening for exposing the recording element substrate to an outside, and includes a plurality of lead electrodes projecting inward of the opening, the flexible film wiring substrate connected to the recording element substrate so as to apply an electrical signal to the discharge energy generation element;
    a plurality of electrode pads provided on the recording element substrate, the electrode pads electrically connected to the lead electrodes, respectively so as to electrically connect the recording element substrate to the flexible film wiring substrate;
    a dummy lead which is provided inward of the opening to protrude to be shorter than each of the lead electrodes, and which is not electrically connected to each of the electrode pad, the dummy lead provided to be adjacent to at least one lead electrode group comprising of a plurality of lead electrodes among the plurality of lead electrodes;
    wherein a plurality of the recording element substrates are provided in the opening, and the dummy lead is provided near end portions of the plurality of recording element substrates adjacent to each other; and
    wherein a gap between each of the lead electrodes and the dummy lead is set to fall within a range of $0.75P \leq P \leq 1.25P$, where P is an arrangement pitch of the plurality of lead electrodes.

11. The liquid jet recording head according to claim 10, wherein the dummy lead is provided on the flexible film wiring substrate.

12. The liquid jet recording head according to claim 10, wherein electric connection sections between the lead electrodes and the electrode pads, and the dummy lead are sealed by a sealing resin so as to cover the electric connection sections and the dummy leads.

13. The liquid jet recording head according to claim 10, wherein the dummy lead is provided near each of both end portions of the lead electrode group in an arrangement direction.

14. The liquid jet recording head according to claim 10, wherein the dummy lead is arranged at a pitch equal to a pitch at which the lead electrodes are arranged.

15. The liquid jet recording head according to claim 10, wherein a plurality of the dummy leads are arranged between the adjacent lead electrode groups, thereby preventing a gap larger than a desired gap from being formed between the plurality of lead electrodes.

16. The liquid jet recording head according to claim 10, wherein the dummy lead has a larger width than a width of each of the lead electrodes, thereby preventing a gap larger than a predetermined gap from being formed between the plurality of lead electrodes.

17. The liquid jet recording head according to claim 10, wherein the lead electrodes and the dummy lead are manufactured in a same manufacturing step.

* * * * *

UNITED STATES PATENT AND TRADEMARK OFFICE
CERTIFICATE OF CORRECTION

PATENT NO. : 7,118,199 B2
APPLICATION NO. : 10/773923
DATED : October 10, 2006
INVENTOR(S) : Toshihiro Mori It is certified that error appears in the above-identified patent and that said Letters Patent is hereby corrected as shown below:

At Column 7:

Line 12, please delete "element substrates (1a and 1b)" and insert -- element substrates 1 (1a and 1b) --.

Signed and Sealed this

Fifth Day of December, 2006

JON W. DUDAS
*Director of the United States Patent and Trademark Office*